US012721005B2

(12) United States Patent
Shang et al.

(10) Patent No.: US 12,721,005 B2
(45) Date of Patent: Aug. 25, 2026

(54) DISPLAY PANEL AND FABRICATING METHOD THEREOF, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yanyang Shang, Beijing (CN); Peng Hou, Beijing (CN); Zhu Wang, Beijing (CN); Zhenglong Yan, Beijing (CN); Shuo Li, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 565 days.

(21) Appl. No.: 18/028,325

(22) PCT Filed: Jun. 20, 2022

(86) PCT No.: PCT/CN2022/099840

§ 371 (c)(1),
(2) Date: Mar. 24, 2023

(87) PCT Pub. No.: WO2023/245339

PCT Pub. Date: Dec. 28, 2023

(65) Prior Publication Data

US 2024/0324405 A1 Sep. 26, 2024

(51) Int. Cl.
*H10K 59/80* (2023.01)
*H10K 71/00* (2023.01)

(52) U.S. Cl.
CPC ......... *H10K 59/873* (2023.02); *H10K 71/621* (2023.02)

(58) Field of Classification Search
None
See application file for complete search history.

(56) References Cited

U.S. PATENT DOCUMENTS

2021/0134912 A1 5/2021 Kim et al.
2021/0193960 A1* 6/2021 Song .................... H10K 59/873
(Continued)

FOREIGN PATENT DOCUMENTS

CN 109935621 A 6/2019
CN 111276524 A 6/2020
(Continued)

*Primary Examiner* — Vongsavanh Sengdara
(74) *Attorney, Agent, or Firm* — IPro, PLLC

(57) ABSTRACT

Provided are a display panel, a fabricating method thereof, and a display device. The method includes: forming and patterning a first source-drain material film layer, forming a first source-drain layer in a display region, forming at least one isolation pillar transition pattern in a via-hole encapsulation region; etching a second metal layer to form a recessed part; forming an anode material film layer on the first source-drain layer; forming a first pad located on the protective layer and a second pad located around the isolation pillar; forming a photoresist material film layer on the anode material film layer, exposing the photoresist material film layer to form a patterned photoresist layer in the display region, and completely retaining the photoresist material film layer in the via-hole encapsulation region; etching the anode material film layer to form an anode layer; and stripping off the photoresist material film layer.

17 Claims, 12 Drawing Sheets

(56) References Cited

U.S. PATENT DOCUMENTS

| | | | | |
|---|---|---|---|---|
| 2022/0077423 | A1* | 3/2022 | Zhang | H10K 71/621 |
| 2022/0344421 | A1* | 10/2022 | Huang | H10K 59/124 |
| 2023/0095920 | A1* | 3/2023 | Zhou | H10K 59/873<br>257/40 |
| 2023/0157096 | A1 | 5/2023 | Zhou et al. | |

FOREIGN PATENT DOCUMENTS

| | | | |
|---|---|---|---|
| CN | 112510071 | A | 3/2021 |
| CN | 113497089 | A | 10/2021 |
| CN | 113767476 | A | 12/2021 |
| WO | 2021007712 | A1 | 1/2021 |

* cited by examiner

DISPLAY PANEL AND FABRICATING METHOD THEREOF, AND DISPLAY DEVICE

CROSS REFERENCE TO RELATED APPLICATIONS

The present disclosure is a National Stage of International Application No. PCT/CN2022/099840, filed Jun. 20, 2022.

FIELD

The present disclosure relates to the field of display technology, in particular, to a display panel and a fabricating method thereof, and a display device.

BACKGROUND

With the development of display technology, organic light emitting diodes (OLED) have promoted display diversification and have become the mainstream of display technology. However, with the rapid development of display technology, there is an increasing demand on the screen ratio of the display screen by users. In order to increase the screen ratio of the display screen, elements such as front camera, light sensor and the like can be placed in the via-hole by forming the via-hole on the screen, i.e., AA hole product.

For an OLED display panel, the via-hole region is prone to water oxygen ingress and the like. To reduce the risk of water oxygen intrusion, an isolation pillar may be formed through the source and drain metal layer at the via-hole encapsulation region between the via-hole and the display region, the isolation pillar serving to isolate the organic light-emitting layer and the cathode, and thus severing water oxygen intrusion into the channel.

SUMMARY

An embodiment of the present disclosure provides a display panel and a fabricating method thereof, and a display device, and the solutions are as follows.

An embodiment of the present disclosure provides a fabricating method of a display panel, including:

- providing a substrate, where the substrate is provided with a display region, a via-hole, and a via-hole encapsulation region between the display region and the via-hole;
- forming a first source-drain material film layer on a side of the substrate;
- patterning the first source-drain material film layer to form a first source-drain layer at the display region and at least one isolation pillar transition pattern at the via-hole encapsulation region; where each of the at least one isolation pillar transition pattern includes a first metal layer, a second metal layer, and a third metal layer disposed in stacked;
- etching the second metal layer to make a sidewall of the second metal layer concave inward to form a recessed part, where the first metal layer, the third metal layer and the second metal layer with the recessed part form the isolation pillar;
- forming an anode material film layer on a side of the first source-drain layer away from the substrate, making the anode material film layer disconnected at the isolation pillar to form a first pad located on a side of a protective layer facing away from the substrate and a second pad located around the isolation pillar and on the substrate;

- forming a photoresist material film layer on a side of the anode material film layer facing away from the substrate;
- exposing the photoresist material film layer to develop to form a patterned photoresist layer in the display region, and completely retaining the photoresist material film layer in the via-hole encapsulation region;
- etching the anode material film layer to form an anode layer; and
- stripping off the photoresist material film layer.

In some embodiments, in the above fabricating method according to an embodiment of the present disclosure, before etching the second metal layer, the method further includes:

- forming a passivation material film layer on a side of the first source-drain layer and the isolation pillar transition pattern facing away from the substrate; and
- patterning the passivation material film layer to form a passivation layer on the display region on a side of the first source-drain layer facing away from the substrate and a protective layer on a side of the isolation pillar transition pattern facing away from the substrate; where the protective layer covers the isolation pillar transition pattern.

In some embodiments, in the above fabricating method provided by an embodiment of the present disclosure, after forming the passivation layer and the protective layer, and before etching the second metal layer, the method further includes:

- forming a second source-drain material film layer on a side of the passivation layer and the protective layer facing away from the substrate;
- patterning the second source-drain material film layer with a dry etching process to completely remove the second source-drain material film layer in the via-hole encapsulation region, and form a second source-drain layer in the display region; and
- the etching the second metal layer, includes: extending a time of the dry etching process to etch the second metal layer after etching the second source-drain material film layer.

In some embodiments, in the above fabricating method according to an embodiment of the present disclosure, the patterning the passivation material film layer, includes: etching the passivation material film layer with a first etching gas; and the etching the second metal layer, includes: etching the second metal layer with a second etching gas; where the second etching gas and the first etching gas are different.

In some embodiments, in the above fabricating method provided by an embodiment of the present disclosure, after forming the isolation pillar, and before forming the anode material film layer on a side of the first source-drain layer facing away from the substrate, the method further includes:

- forming a second source-drain material film layer on a side of the passivation layer and the protective layer facing away from the substrate; and
- patterning the second source-drain material film layer with a dry etching process to completely remove the second source-drain material film layer in the via-hole encapsulation region, and form a second source-drain layer in the display region.

In some embodiments, in the above fabricating method provided by an embodiment of the present disclosure, after forming the second source-drain layer, and before forming the anode material film layer, the method further includes:

forming a first planarization material film layer on a side of the second source-drain layer facing away from the substrate; and patterning the first planarization material film layer to completely remove the first planarization material film layer in the via-hole encapsulation region, and form a first planarization layer in the display region.

In some embodiments, in the above fabricating method provided by an embodiment of the present disclosure, before forming the second source-drain material film layer on a side of the passivation layer and the protective layer facing away from the substrate, the method further includes:

forming a second planarization material film layer on a side of the passivation layer and the protective layer facing away from the substrate; and patterning the second planarization material film layer to completely remove the second planarization material film layer in the via-hole encapsulation region, and form a second planarization layer in the display region.

In some embodiments, in the fabricating method provided by an embodiment of the present disclosure, after forming the anode layer, the method further includes:

forming a light emitting layer on a side of the anode layer facing away from the substrate, where the light emitting layer is disconnected at the location of the isolation pillar; and forming a cathode layer on a side of the light emitting layer facing away from the substrate, where the cathode layer is disconnected at the location of the isolation pillar.

An embodiment of the present disclosure also provides a display panel fabricated by the fabricating method of the display panel according to any one of the above, the display panel is provided with an via-hole extending through the display panel in a thickness direction, and the display panel includes:

a substrate, where the substrate provided with a display region and a via-hole encapsulation region between the display region and the via-hole;

a first source-drain layer located in the display region of the substrate;

at least one isolation pillar located at the via-hole encapsulation region of the substrate; where the isolation pillar and the first source-drain layer are disposed on a same layer and made of a same material, the isolation pillar includes a first metal layer, a second metal layer, and a third metal layer disposed in stacked, and a sidewall of the second metal layer is concave inward to form a recessed part;

an anode layer disposed in the display region and on a side of the first source-drain layer facing away from the substrate;

a first pad disposed in the via-hole encapsulation region and on a side of the isolation pillar facing away from the substrate, where the first pad and the anode layer are disposed on a same layer and made of a same material; and a second pad disposed around the isolation pillar and on the substrate, where the second pad and the anode layer are disposed on a same layer and made of a same material;

where the anode layer, the first pad, and the second pad are disconnected from each other.

In some embodiments, the above display panel provided by an embodiment of the present disclosure further includes: a passivation layer located in the display region and between the first source-drain layer and the anode layer, and a protective layer located in the via-hole encapsulation region and between the isolation pillar and the first pad;

where the protective layer and the passivation layer are disposed on a same layer and made of a same material, and the protective layer covering the isolation pillar.

In some embodiments, the above display panel provided by an embodiment of the present disclosure further includes: a second source-drain layer located in the display region and between the passivation layer and the anode layer;

a first planarization layer located in the display region and between the second source-drain layer and the anode layer; and a second planarization layer located in the display region and between the passivation layer and the second source-drain layer.

In some embodiments, the above display panel provided by an embodiment of the present disclosure further includes: a light emitting layer on a side of the anode layer facing away from the substrate; and a cathode layer on a side of the light emitting layer facing away from the substrate;

where the light emitting layer and the cathode layer each are disconnected at the location of the isolation pillar.

An embodiment of the present disclosure also provides a display device including the display panel according to any one of the above provided by an embodiment of the present disclosure.

DETAILED DESCRIPTION OF THE EMBODIMENTS

Figure 1:
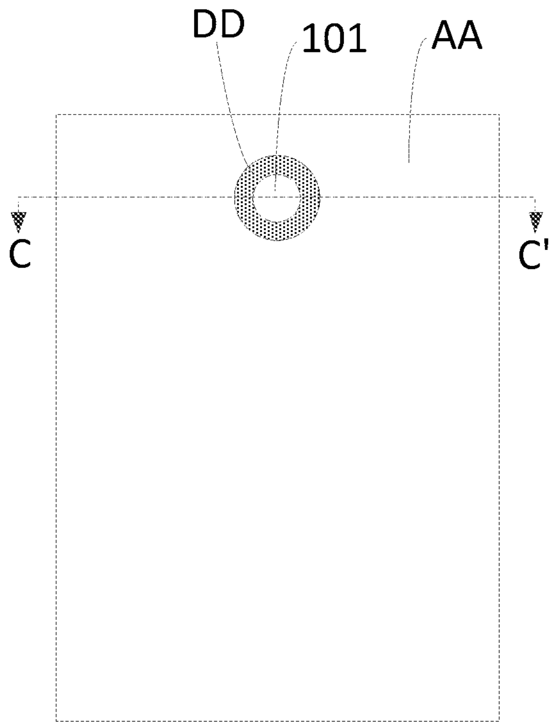
FIG. 1 is a schematic diagram of a plane structure of a display panel according to an embodiment of the present disclosure.

In order to make the objectives, solutions and advantages of embodiments of the present disclosure more clear, solutions of embodiments of the present disclosure will be clearly and completely described below in conjunction with the accompanying drawings of embodiments of the present disclosure. Clearly, the described embodiments are some, but not all, embodiments of the present disclosure. Embodiments and features of the embodiments in the present disclosure may be combined with each other without conflict. Based on the described embodiments of the present disclosure, all other embodiments obtained by a person of ordinary skill in the art without inventive effort fall within the scope of protection of the present disclosure.

Unless otherwise defined, technical or scientific terms used in the present disclosure shall have a general meaning as understood by a person of ordinary skill in the art to which the present disclosure pertains. The words "including," "comprising," and the like are used in this disclosure to mean that elements or items preceding the word appear to encompass elements or items listed after the word and equivalents thereof, but not to the exclude other elements or items. "Connecting" or "connected" and the like are not restricted to physical or mechanical connections, but can include electrical connections, whether direct or indirect. "Inner", "outer", "upper", "lower" and the like are only used to indicate relative positional relationships, which may change accordingly when the absolute position of the object being described changes.

It should be noted that the sizes and shapes of the figures in the drawings do not reflect true scales, but are merely illustrative of the present disclosure. The same or similar reference numerals throughout refer to the same or similar elements or elements having the same or similar function.

As shown in FIG. 1, a via-holed screen generally includes a display region AA in which a via-hole 101 is formed, where a camera, an infrared sensor, a panel identification module, or the like can be placed to improve the screen ratio of the display device. The via-holed screen also needs to be provided with a via-hole encapsulation region DD located between the display region AA and the via-hole 101 and surrounding the via-hole 101 in order to achieve efficient encapsulation.

Figure 2:
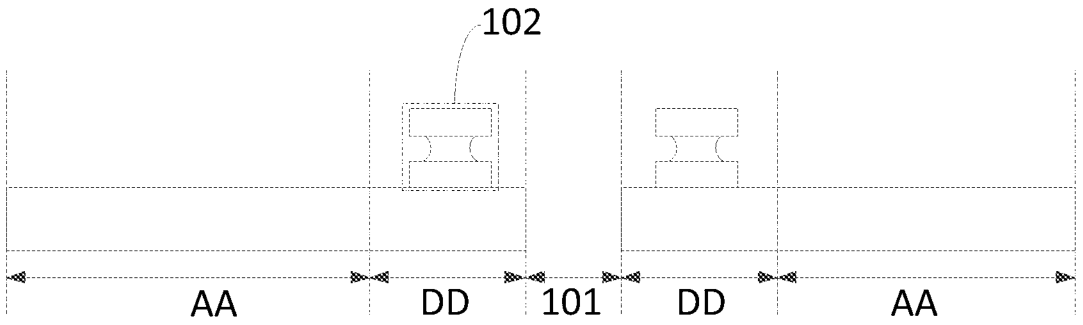
FIG. 2 is a schematic cross-sectional view taken along the CC' direction of FIG. 1.

In the related art, as shown in FIGS. 1 and 2, FIG. 1 is a schematic plane diagram of a display panel, FIG. 2 is a schematic cross-sectional view of FIG. 1 along the CC' direction, in order to improve the encapsulation effect of the OLED display panel in the via-hole encapsulation region DD, isolation pillars 102 surrounding the via-hole 101 can be formed with the source-drain metal layer, and the organic light-emitting layer and the cathode located within the display region AA are disconnected from the organic light-emitting layer and the cathode located within the via-hole encapsulation region DD with the isolation pillars 102 for the purpose of severing water oxygen intrusion into the channel, FIG. 2 illustrates only the isolation pillars 102 located within the via-hole encapsulation region DD. During preparation, the source-drain metal layer may be first patterned to form an isolation pillar transition pattern around the via-hole, the isolation pillar transition pattern may include a titanium layer, an aluminum layer, and a titanium layer stacked sequentially; then, when the anode of the display region is patterned, the anodic etchant may partially etch the aluminum layer, to form an approximately "I" shaped isolation pillar, the anode may generate silver nitrate during etching, which may undergo displacement reactions with aluminum to generate silver particles, the silver particles may remain in the display region and cause short circuits between the anode and cathode, which may result in poor dark spots of the display panel.

Figure 3:
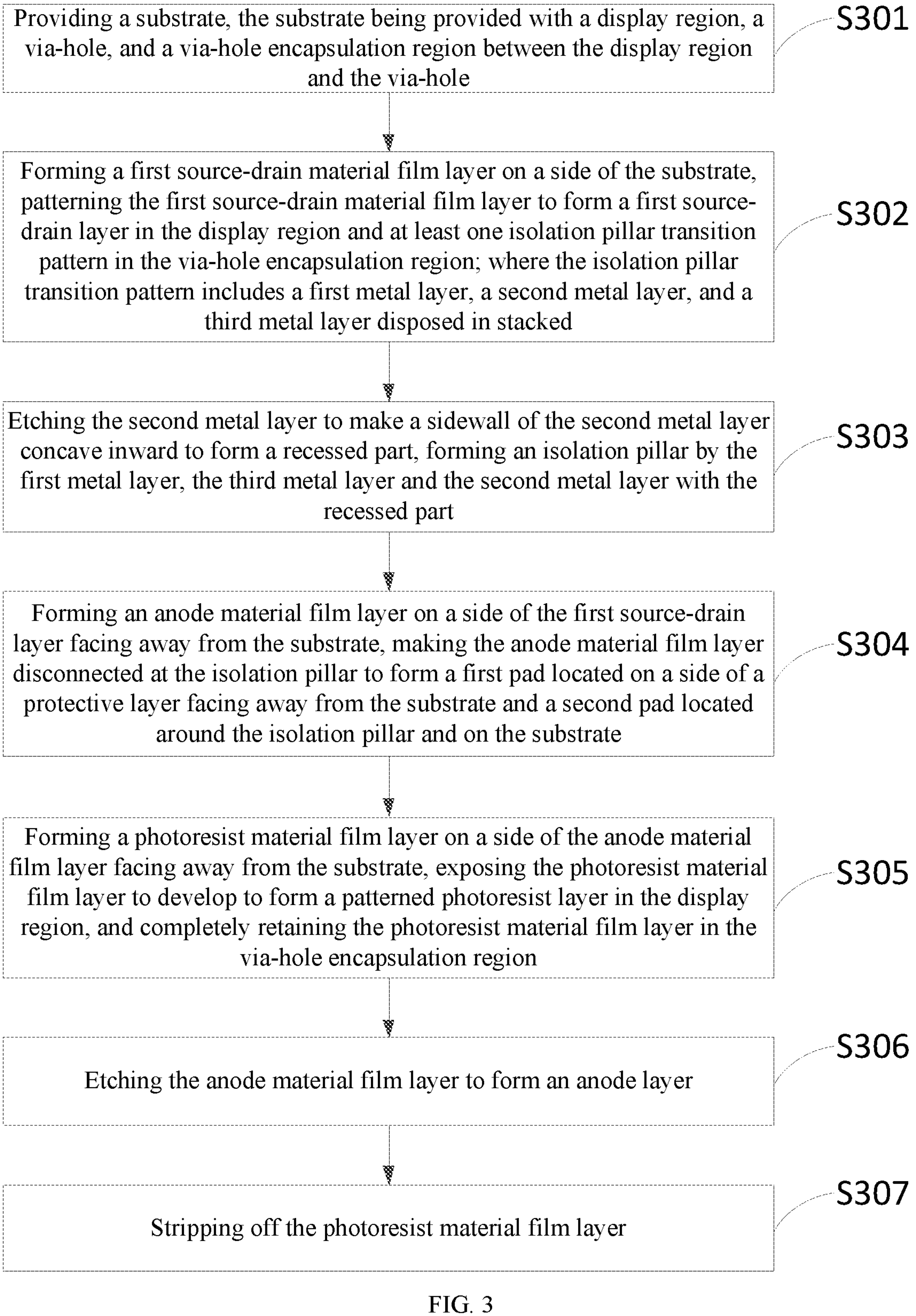
FIG. 3 is a flowchart illustrating a fabricating method of a display panel according to an embodiment of the present disclosure.

In view of this, an embodiment of the present disclosure provides a fabricating method of a display panel, as shown in FIG. 3, including:

- S301, a substrate is provided, where the substrate is provided with a display region, a via-hole, and a via-hole encapsulation region between the display region and the via-hole;
- S302, a first source-drain material film layer is formed on a side of the substrate, the first source-drain material film layer is patterned to form a first source-drain layer in the display region and at least one isolation pillar transition pattern in the via-hole encapsulation region; wherein the isolation pillar transition pattern includes a first metal layer, a second metal layer, and a third metal layer disposed in stacked;
- S303, the second metal layer is etched to make a sidewall of the second metal layer concave inward to form a recessed part, an isolation pillar is formed by the first metal layer, the third metal layer and the second metal layer with the recessed part;
- S304, an anode material film layer is formed on a side of the first source-drain layer facing away from the substrate, the anode material film layer is disconnected at the isolation pillar to form a first pad located on a side of a protective layer facing away from the substrate and a second pad located around the isolation pillar and on the substrate;
- S305, a photoresist material film layer is formed on a side of the anode material film layer facing away from the substrate, the photoresist material film layer is exposed to develop to form a patterned photoresist layer in the display region, and the photoresist material film layer is completely retained in the via-hole encapsulation region;
- S306, the anode material film layer is etched to form an anode layer; and
- S307, the photoresist material film layer is stripped off.

In the above-described fabricating method of the display panel provided by an embodiment of the present disclosure, the isolation pillar is formed prior to forming the anode layer, and the photoresist material film layer of the via-hole encapsulation region is completely retained while etching the anode material film layer, which may avoid contact between the etchant that etches the anode material film layer and the second metal layer of the isolation pillar and avoid the creation of metal particles while forming the anode layer, thereby avoiding the problem of undesirable dark spots from the metal particles.

The fabricating method of the display panel provided by an embodiment of the present disclosure is further explained below in conjunction with the accompanying drawings.

Embodiment 1

Figure 4A:
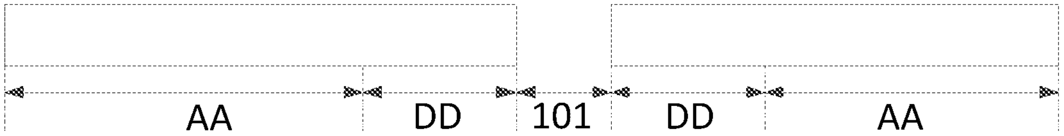
FIGS. 4A to 4O are schematic cross-sectional views of embodiments of the present disclosure after steps are performed in fabricating a display panel.

(1) As shown in FIG. 4A, a substrate 10 is provided, the substrate 10 is provided with a display region AA, a via-hole 101, and a via-hole encapsulation region DD located between the display region AA and the via-hole 101; in particular, the substrate 10 can be a rigid substrate, e.g., the material of the substrate 10 can be glass, sapphire, etc.; the substrate 10 may also be a flexible substrate, for example the material of the substrate 10 may be polyimide (PI) or the like.

Figure 4B:
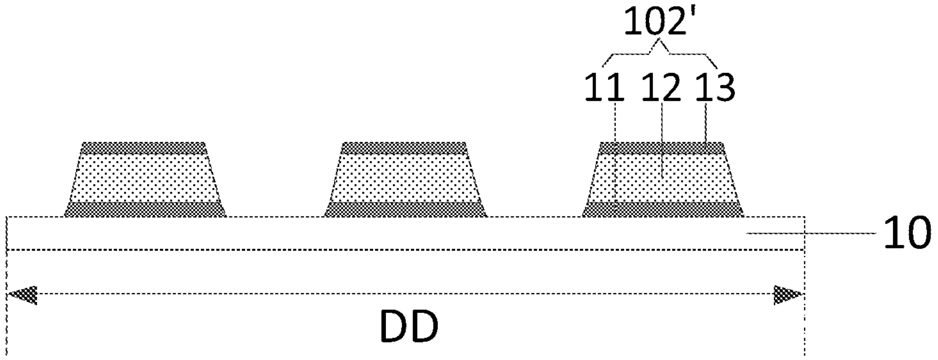

(2) A first source-drain material film layer is formed on a side of the substrate 10, the first source-drain material film layer is patterned to form the first source-drain layer at the display region and at least one isolation pillar transition pattern 102' at the via-hole encapsulation region DD as shown in FIG. 4B (for example, three isolation pillar transition patterns 102' are formed); the isolation pillar transition pattern 102' includes a first metal layer 11, a second metal layer 12, and a third metal layer 13 disposed in layers. In particular, the material of the first and third metal layers 11, 13 may be Ti and the material of the second metal layer 12 may be Al.

It should be noted that only the film layer structure of the via-hole encapsulation region DD of the display panel is illustrated in each fabrication step of the embodiment of the present disclosure.

Figure 4C:
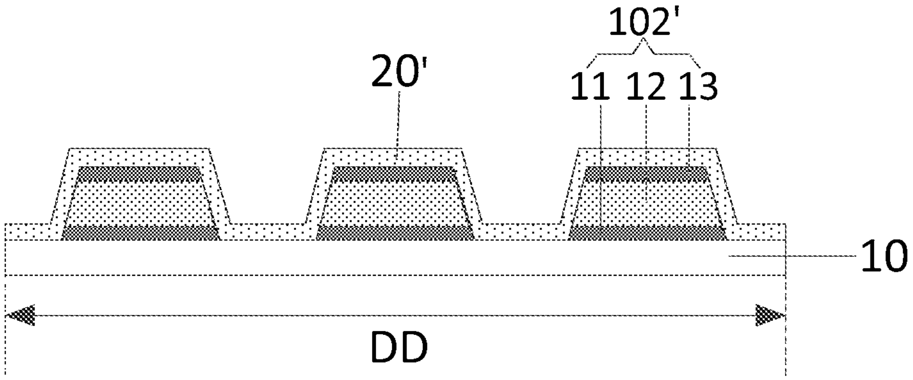
Figure 4D:
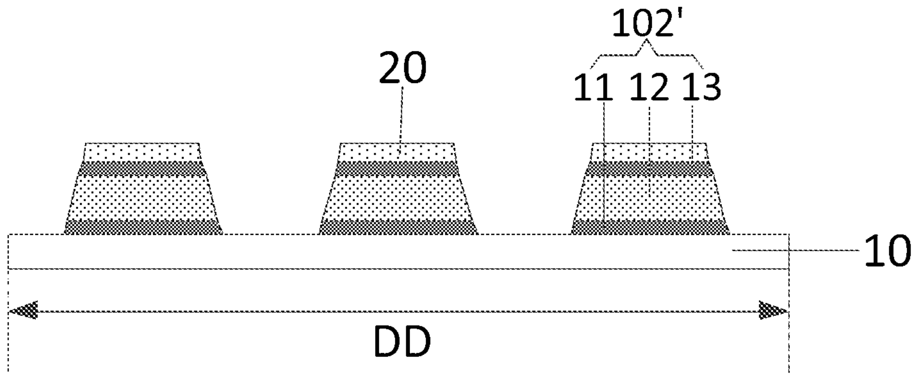

(3) A passivation material film layer 20' is formed on a side of the first source-drain layer and the isolation pillar transition patterns 102' facing away from the substrate 10, as shown in FIG. 4C; as shown in FIG.

4D, the passivation material film layer 20' is patterned to form a passivation layer on a side of the first source-drain layer facing away from the substrate at the display region and a protective layer 20 on a side of the isolation pillar transition pattern 102' facing away from the substrate 10; the protective layer 20 covers the isolation pillar transition pattern 102'. In particular, the protective layer 20 on the one hand can further increase the segmental difference of the via-hole encapsulation region DD to ensure that the subsequently formed light emitting layer and cathode layer are disconnected at the via-hole encapsulation region DD, and on the other hand can protect the third metal layer 13 from being etched upon subsequent etching of the second metal layer 12 to form the isolation pillar of the "I" type.

Figure 4E:
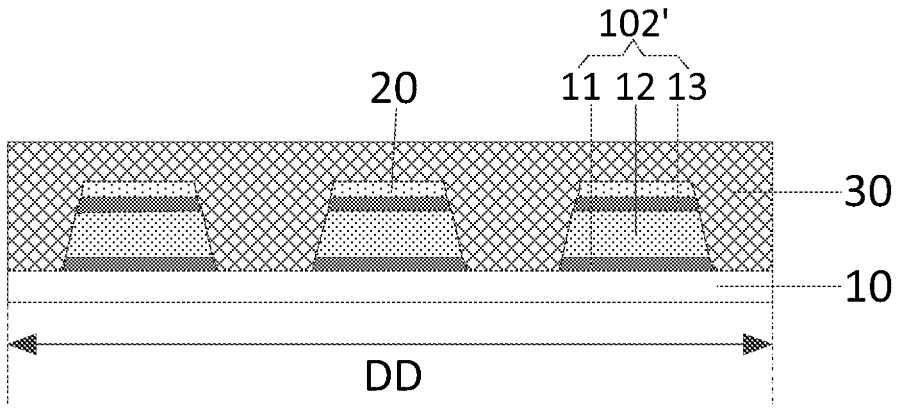
Figure 4F:
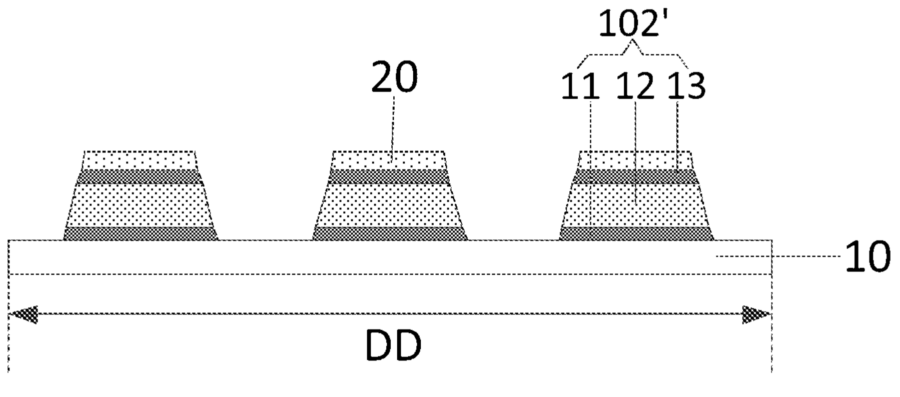

(4) A second planarization material film layer 30 is formed on a side of the passivation layer and the protective layer 20 facing away from the substrate 10, as shown in FIG. 4E; as shown in FIG. 4F, the second planarization material film layer 30 is patterned to completely remove the second planarization material film layer 30 of the via-hole encapsulation region DD so as to form a second planarization layer at the display region.

Figure 4G:
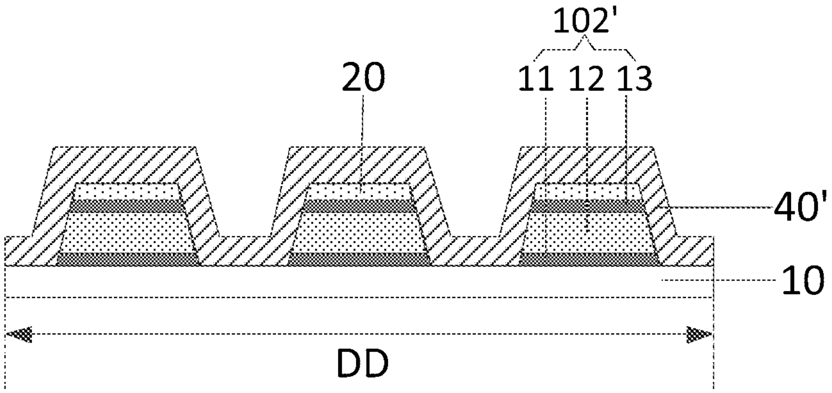
Figure 4H:
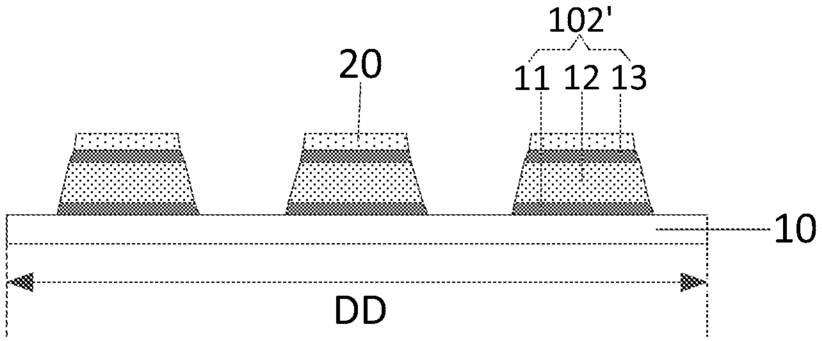

(5) As shown in FIG. 4G, a second source-drain material film layer 40' is formed on a side of the second planarization layer and the protective layer 20 facing away from the substrate 10; as shown in FIG. 4H, the second source-drain material film layer 40' is patterned using a dry etching process (etching gas can be $Cl_2$), to completely remove the second source-drain material film layer 40' of the via-hole encapsulation region DD, and form the second source-drain layer at the display region.

Figure 4I:
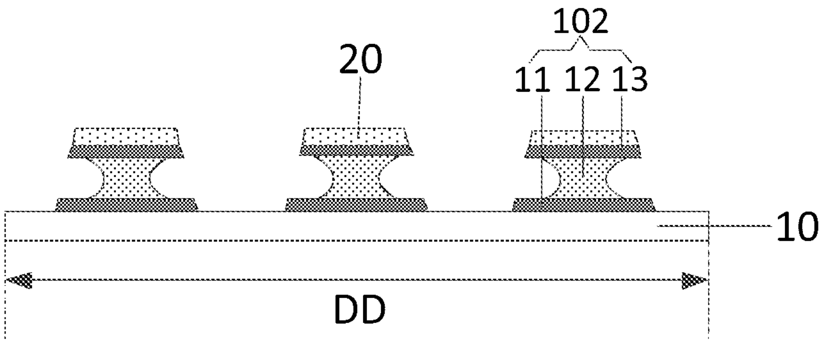

(6) As shown in FIG. 4I, after the etching of the second source-drain material film layer 40' is completed in FIG. 4H, the time of the dry etching process to the second source-drain material film layer 40' is extended to etch (overetch) the second metal layer 12, the sidewall of the second metal layer 12 is concave inward to form a recessed part, the first metal layer 11, the third metal layer 13 and the second metal layer 12 with the recessed part constitutes the isolation pillar 102. The embodiments of the present disclosure only need to extend the time of the dry etching process to the second source-drain material film layer 40', without adding a mask and a new process flow, which can reduce cost and improve production capacity.

It should be noted that, due to the high selectivity of different gases of the dry etching process, for example, $Cl_2$ has a lower etching rate on the passivation material film layer, while the etching rate on the second metal layer 12 (Al) is high, and $Cl_2$ does not have an effect on the third metal layer 13 (Ti) since the third metal layer 13 is covered by the protective layer 20, in the subsequent $Cl_2$ etching, a side of the second metal layer 12 (Al) is largely laterally etched to form the I-shaped isolation pillar 102.

It should be noted that although the time of the dry etching process to the second source-drain material film layer 40' is prolonged, the second source-drain layer formed in the display region is overetched when the second metal layer 12 is etched, but only the middle metal layer of the second source-drain layer is etched without affecting the conductive properties of the second source-drain layer.

Figure 4J:
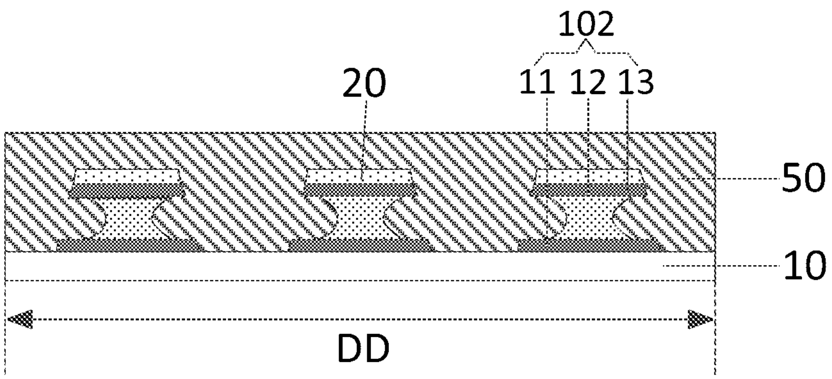
Figure 4K:
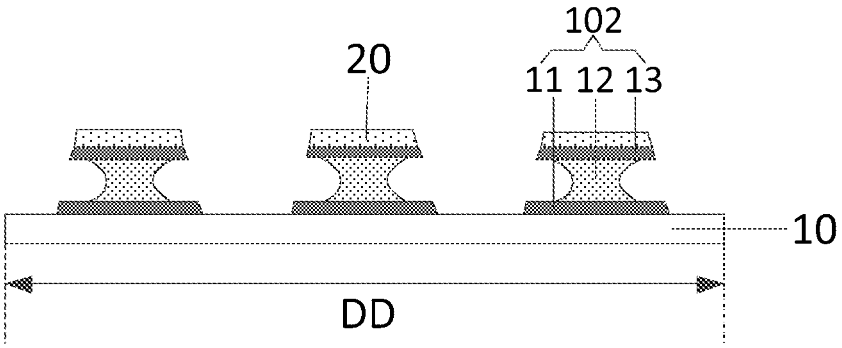

(7) As shown in FIG. 4J, a first planarization material film layer 50 is formed on a side of the second source-drain layer facing away from the substrate 10; as shown in FIG. 4K, the first planarization material film layer 50 is patterned to completely remove the first planarization material film layer 50 from the via-hole encapsulation region DD and a first planarization layer in the display region.

Figure 4L:
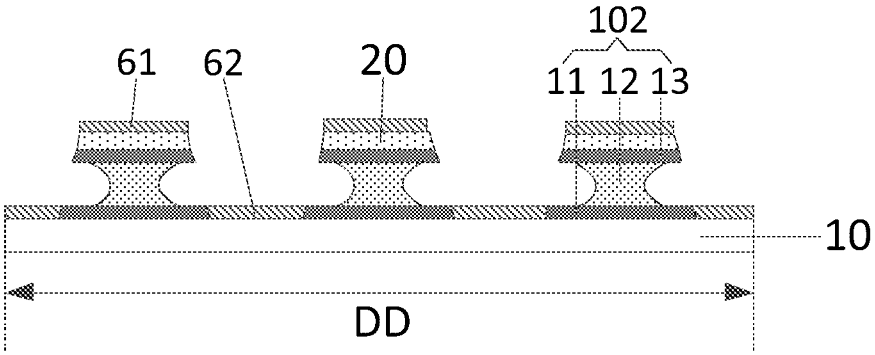

(8) As shown in FIG. 4L, an anode material film layer is formed on a side of the first planarization layer facing away from the substrate 10, the anode material film layer is disconnected at the isolation pillar 102 to form a first pad 61 located on a side of the protective layer 20 facing away from the substrate 10 and a second pad 62 located around the isolation pillar 102 and on the substrate 10.

Figure 4M:
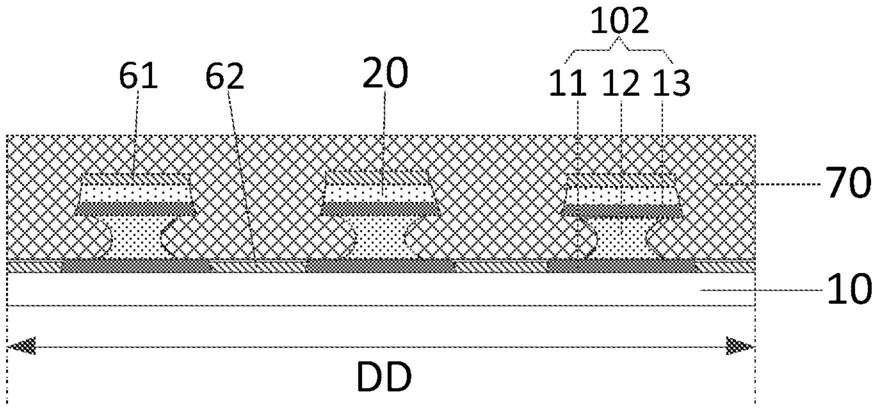

(9) As shown in FIG. 4M, a photoresist material film layer 70 is formed on a side of the anode material film layer facing away from the substrate 10, exposure development is performed on the photoresist material film layer 70, a patterned photoresist layer is formed in the display region, the photoresist material film layer 70 is completely retained in the via-hole encapsulation region DD, such that the photoresist material film layer 70 completely covers the via-hole encapsulation region DD, as a result, contact of subsequently employed anodic etchant with the second metal layer 12 is avoided, thereby avoiding the creation of metal particles upon subsequent formation of the anode layer, and avoiding the problem of undesirable dark spots from the metal particles.

(10) The anode material film layer 70 is etched to form an anode layer (a plurality of patterned anodes) in the display region.

Figure 4N:
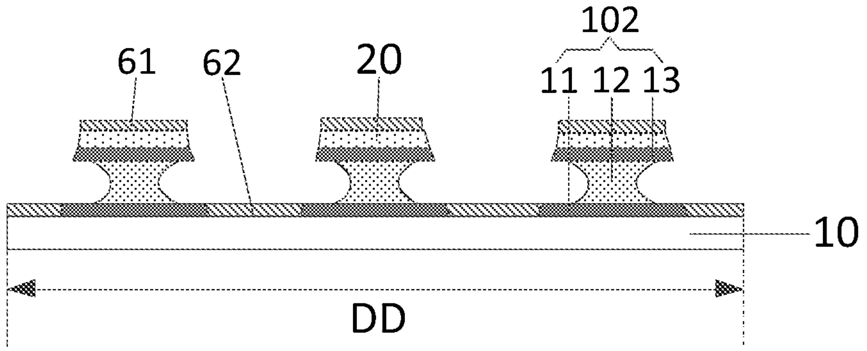

(11) The photoresist material film layer 70 is stripped off as shown in FIG. 4N.

Figure 4O:
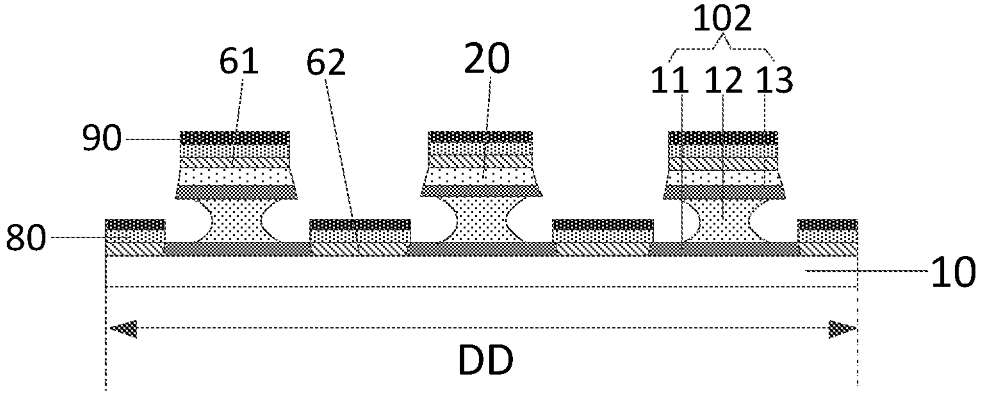

(12) As shown in FIG. 4O, a light emitting layer 80 is formed on a side of the anode layer facing away from the substrate 10, the light emitting layer 80 being disconnected at the location of the isolation pillar 102; a cathode layer 90 is formed on a side of the light emitting layer 80 facing away from the substrate 10, the cathode layer 90 being disconnected at the location of the separation pillar 102. This improves the encapsulation effect of the display panel by disconnecting the light emitting layer 80 and the cathode layer 90 located within the display region from the light emitting layer 80 and the cathode layer 90 located within the via-hole encapsulation region DD using the isolation pillar 102, thereby achieving the purpose of severing water oxygen intrusion into the channel.

In some embodiments, the thickness of the protective layer 20 is approximately 0.3 μm, the thickness of the isolation pillar 102 is approximately 0.7 μm, and the segmental difference at the location of the isolation pillar 102 is approximately 1 μm, and the separation requirements for the light emitting layer 80 and the cathode layer 90 can be met at all.

(13) An encapsulation layer is formed on a side of the cathode layer 90 facing away from the substrate 10, the encapsulation layer may include a first inorganic layer, an organic layer and a second inorganic layer disposed in layers, which is not limited thereto, of course.

In conclusion, the display panel fabricated by the above steps (1) to (13) can avoid the generation of metal particles at the time of forming the anode layer, thereby avoiding the problem of poor dark spot generation from the metal particles; in addition, the isolation pillar 102 is formed by extending the time of the dry etching process of the second source-drain material film layer 40' to etch the second metal layer 12 after the etching of the second source-drain material film layer 40' is completed, which only extends the time of the dry etching process, without adding a Mask and a new process flow, thus reducing cost and improving production capacity.

Embodiment 2

Figure 5A:
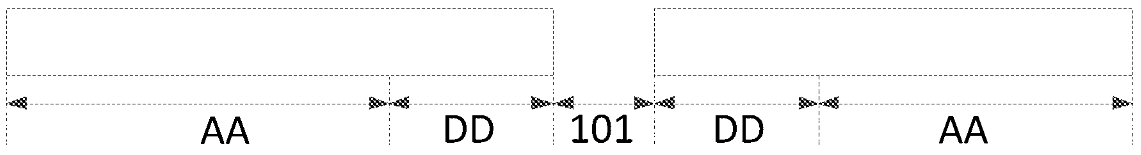
FIGS. 5A to 5O are schematic cross-sectional views of embodiments of the present disclosure after steps are performed in fabricating a display panel.

(1)' As shown in FIG. 5A, a substrate 10 is provided, the substrate 10 is provided with a display region AA, a via-hole 101, and a via-hole encapsulation region DD located between the display region AA and the via-hole 101; in particular, the substrate 10 can be a rigid substrate, e.g., the material of the substrate 10 can be glass, sapphire, etc.; the substrate 10 may also be a flexible substrate, for example the material of the substrate 10 may be polyimide (PI) or the like.

Figure 5B:
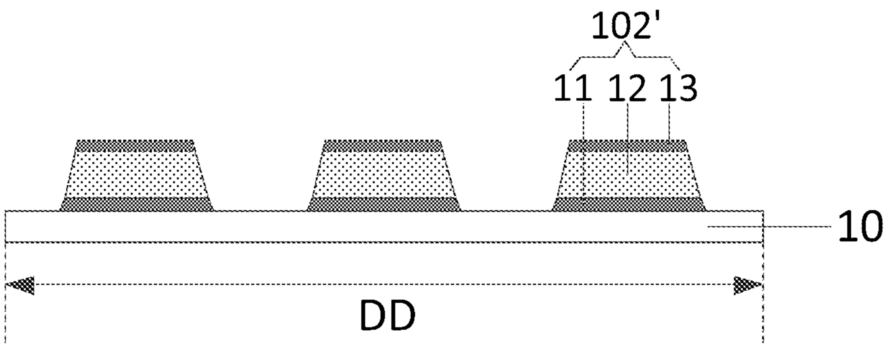

(2)' A first source-drain material film layer is formed on a side of the substrate 10, the first source-drain material film layer is patterned to form the first source-drain layer at the display region and at least one isolation pillar transition pattern 102' at the via-hole encapsulation region DD as shown in FIG. 5B (for example, three isolation pillar transition patterns 102' are formed); the isolation pillar transition pattern 102' includes a first metal layer 11, a second metal layer 12, and a third metal layer 13 disposed in layers. In particular, the material of the first and third metal layers 11, 13 may be Ti and the material of the second metal layer 12 may be Al.

It should be noted that only the film layer structure of the via-hole encapsulation region DD of the display panel is illustrated in each fabrication step of the embodiment of the present disclosure.

Figure 5C:
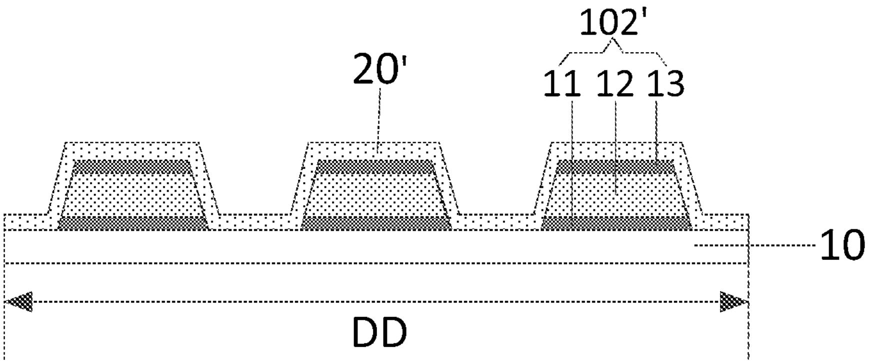
Figure 5D:
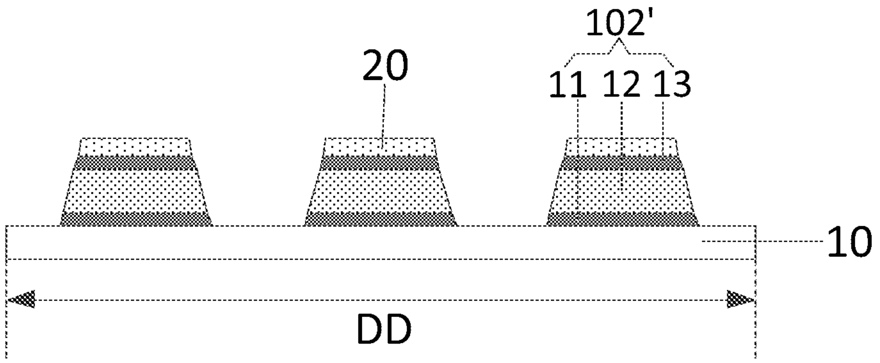

(3)' A passivation material film layer 20' is formed on a side of the first source-drain layer and the isolation pillar transition patterns 102' facing away from the substrate 10, as shown in FIG. 5C; as shown in FIG. 5D, the passivation material film layer 20' is patterned to form a passivation layer on a side of the first source-drain layer facing away from the substrate at the display region and a protective layer 20 on a side of the isolation pillar transition patterns 102' facing away from the substrate 10; the protective layer 20 covers the isolation pillar transition patterns 102'. In some embodiments, the passivation material film layer 20' is patterned, in particular: the passivation material film layer 20' is etched with a first etching gas. The protective layer 20 formed in this way on the one hand can further increase the segmental difference of the via-hole encapsulation region DD to ensure that the subsequently formed light emitting layer and cathode layer are disconnected at the via-hole encapsulation region DD, and on the other hand can protect the third metal layer 13 from being etched upon subsequent etching of the second metal layer 12 to form the isolation pillar of the "I" type.

Figure 5E:
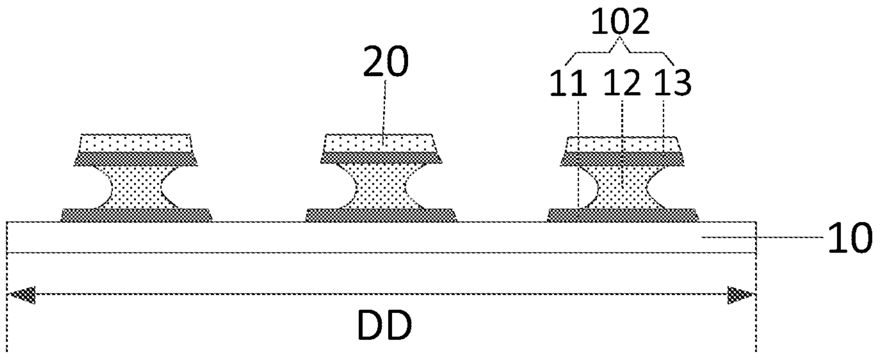

(4)' As shown in FIG. 5E, the second metal layer 12 is etched with a second etching gas, a sidewall of the second metal layer 12 is concave inward to form a recessed part, the first metal layer 12, the third metal layer 14, and the second metal layer 12 with the recessed part form an isolation pillar 102; the second etching gas and the first etching gas are different. The embodiments of the present disclosure only require replacing the etching gas after etching the passivation material film layer 20' with the first etching gas, i.e., etching the second metal layer 12 with a second etching gas different from the first etching gas, the addition of a new Mask and a new process flow is avoided, which can reduce cost and improve production capacity.

In some embodiments, the first etching gas may be $CF_4$, and the second etching gas may be $Cl_2$, which is not limited thereto.

Figure 5F:
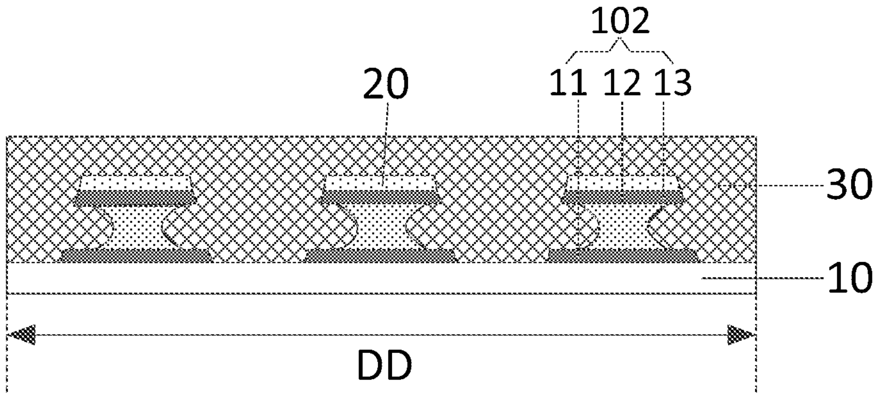
Figure 5G:
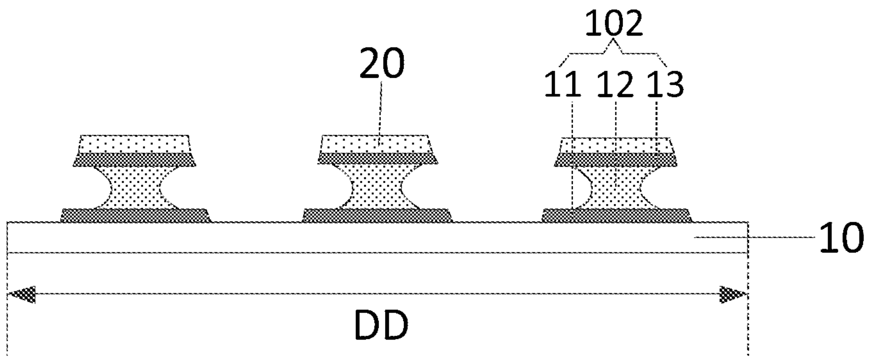

(5)' A second planarization material film layer 30 is formed on a side of the passivation layer and the protective layer 20 facing away from the substrate 10, as shown in FIG. 5F; as shown in FIG. 5G, the second planarization material film layer 30 is patterned to completely remove the second planarization material film layer 30 of the via-hole encapsulation region DD so as to form a second planarization layer at the display region.

Figure 5H:
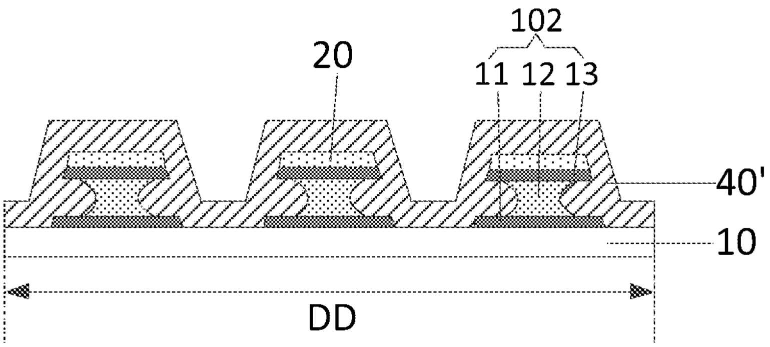
Figure 5I:
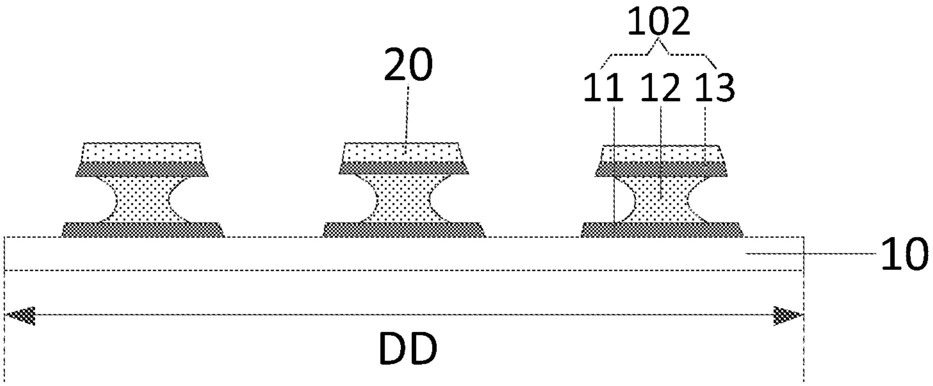

(6)' As shown in FIG. 5H, a second source-drain material film layer 40' is formed on a side of the second planarization layer and the protective layer 20 facing away from the substrate; as shown in FIG. 5I, the second source-drain material film layer 40' is patterned using a dry etching process (etching gas can be $Cl_2$), to completely remove the second source-drain material film layer 40' of the via-hole encapsulation region DD, and form the second source-drain layer at the display region.

Figure 5J:
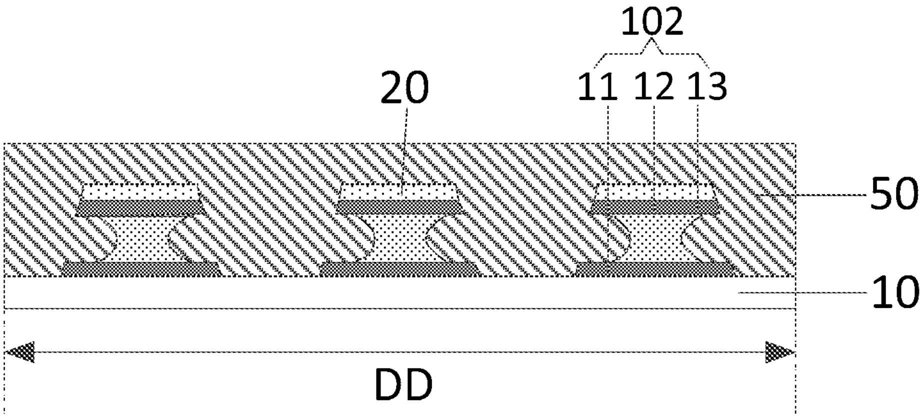
Figure 5K:
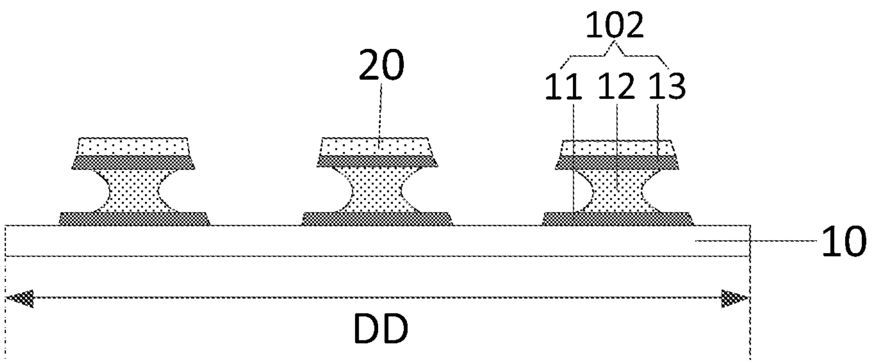

(7)' As shown in FIG. 5J, a first planarization material film layer 50 is formed on a side of the second source-drain layer facing away from the substrate 10; as shown in FIG. 5K, the first planarization material film layer 50 is patterned to completely remove the first planarization material film layer 50 from the via-hole encapsulation region DD and a first planarization layer in the display region.

Figure 5L:
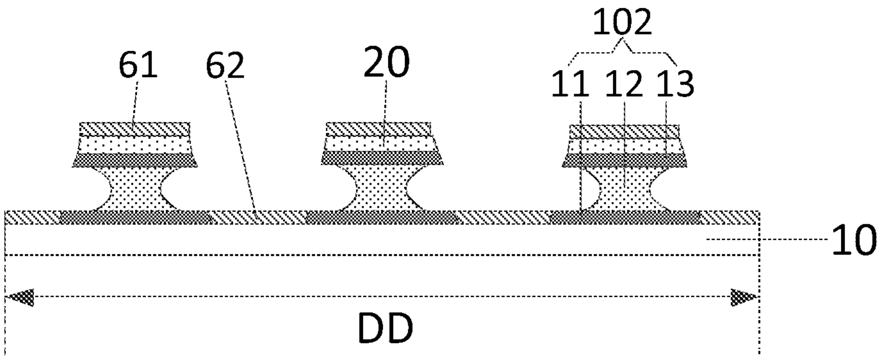

(8)' As shown in FIG. 5L, an anode material film layer is formed on a side of the first planarization layer facing away from the substrate 10, the anode material film layer is disconnected at the isolation pillar 102 to form a first pad 61 located on a side of the protective layer 20 facing away from the substrate 10 and a second pad 62 located around the isolation pillar 102 and on the substrate 10.

Figure 5M:
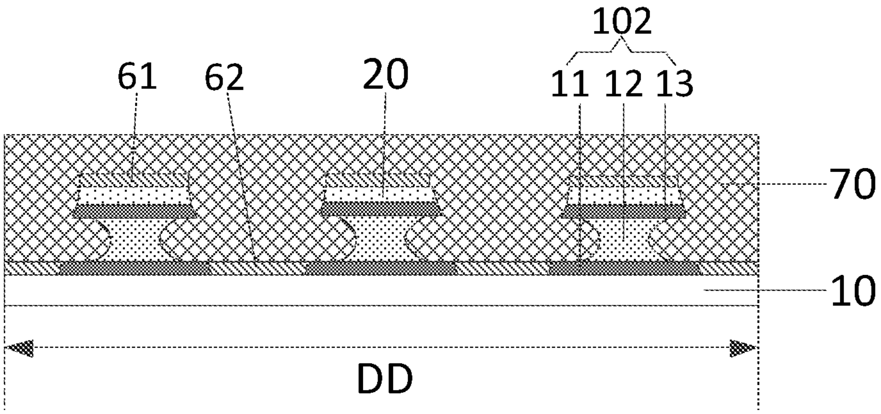

(9)' As shown in FIG. 5M, a photoresist material film layer 70 is formed on a side of the anode material film layer facing away from the substrate 10, exposure development is performed on the photoresist material film layer 70, a patterned photoresist layer is formed in the display region, the photoresist material film layer 70 is completely retained in the via-hole encapsulation region DD, such that the photoresist material film layer 70 completely covers the via-hole encapsulation region DD, as a result, contact of subsequently employed anodic etchant with the second metal layer 12 is avoided, thereby avoiding the creation of metal particles upon subsequent formation of the anode layer, and avoiding the problem of undesirable dark spots from the metal particles.

(10)' The anode material film layer 70 is etched to form an anode layer (a plurality of patterned anodes) at the display region.

Figure 5N:
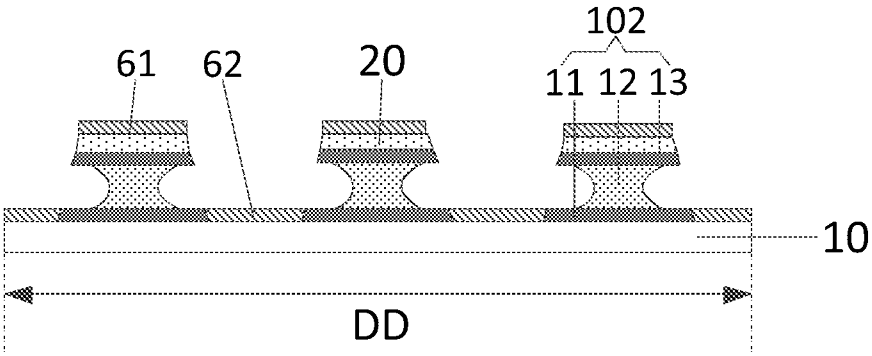

(11)' The photoresist material film layer 70 is stripped off as shown in FIG. 5N.

Figure 5O:
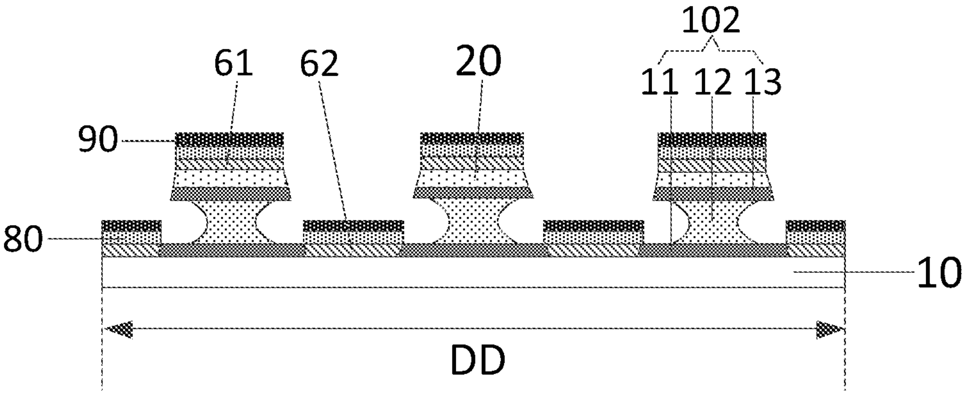

(12)' As shown in FIG. 5O, a light emitting layer 80 is formed on a side of the anode layer facing away from the substrate 10, the light emitting layer 80 being disconnected at the location of the isolation pillar 102; a cathode layer 90 is formed on a side of the light emitting layer 80 facing away from the substrate 10, the cathode layer 90 being disconnected at the location of the separation pillar 102. This improves the encapsulation effect of the display panel by disconnecting the light emitting layer 80 and the cathode layer 90 located within the display region from the light emitting layer 80 and the cathode layer 90 located within the via-hole encapsulation region DD using the isolation pillar 102, thereby achieving the purpose of severing water oxygen intrusion into the channel.

(13)' An encapsulation layer is formed on a side of the cathode layer 90 facing away from the substrate 10, the encapsulation layer may include a first inorganic layer, an organic layer and a second inorganic layer disposed in layers, which is not limited thereto.

In conclusion, the display panel fabricated by the above steps (1)' to (13)' can avoid the generation of metal particles at the time of forming the anode layer, thereby avoiding the problem of poor dark spot generation from the metal particles; in addition, after etching the passivation material film layer 20' with the first etching gas is completed, the etching gas is replaced, that is, the second metal layer 12 is etched with a second etching gas different from the first etching gas, the addition of a new Mask and a new process flow is not required, thus reducing cost and improving production capacity.

It should be noted that the structures of the display panels formed in Embodiments 1 and 2 are the same.

Based on the same inventive concept, an embodiment of the present disclosure also provides a display panel fabricated using the aforementioned fabricating method of the display panel, as shown in FIG. 1, FIG. 4O, and FIG. 5O. FIG. 4O and FIG. 5O are schematic cross-sectional views in the CC' direction in FIG. 1. The display panel has an via-hole 101 penetrating the display panel in the thickness direction, and the display panel includes:

- a substrate 10 provided with a display region AA and a via-hole encapsulation region DD located between the display region AA and the via-hole 101;
- a first source-drain layer located in the display region of the substrate 10; FIGS. 4O and 5O provided by embodiments of the present disclosure merely illustrate the film layer structure of the via-hole encapsulation region DD;
- at least one isolation pillar 102 (three isolation pillars 102 as an example) located at the via-hole encapsulation region DD of the substrate 10; the isolation pillar 102 and the first source-drain layer are disposed on a same layer and made of the same material, the isolation pillar 102 includes a first metal layer 11, a second metal layer 12 and a third metal layer 13 disposed in layers, and a sidewall of the second metal layer 12 is concave inward to form a recessed part, i.e. the isolation pillar 102 is shaped in the form of an "I";
- an anode layer located in the display region AA and on a side of the first source-drain layer facing away from the substrate 10;
- a first pad 61 located in the via-hole encapsulation region DD and on a side of the isolation pillar 102 facing away from the substrate 10, the first pad 61 and the anode layer being disposed on a same layer and made of the same material; and
- a second pad 62 located around the isolation pillar 102 and on the substrate 10, the second pad 62 and the anode layer being disposed on a same layer and made of the same material, the anode layer, the first pad 61 and the second pad 62 are disconnected from each other.

The above-described display panel provided by an embodiment of the present disclosure can be formed using the foregoing fabricating method of the display panel, the display panel made by the present disclosure can avoid contact between the etchant that etches the anode material film layer and the second metal layer of the isolation pillar, avoiding the creation of metal particles while forming the anode layer, and further avoiding the problem of undesirable dark spots from the metal particles. A new Mask and a new process flow are not required, which can reduce cost and improve production capacity.

In some embodiments, the above display panel provided by an embodiment of the present disclosure, as shown in FIGS. 4O and 5O, further includes: a passivation layer (not shown) located in the display region and between the first source-drain layer and the anode layer, and a protective layer 20 located in the via-hole encapsulation region DD and between the isolation pillar 102 and the first pad 61; the protective layer 20 and the passivation layer are disposed on a same layer and made of the same material, and the protective layer 20 covers the isolation pillars 102. In particular, the protective layer 20 on the one hand can further increase the segmental difference of the via-hole encapsulation region DD to ensure that the subsequently formed light emitting layer and cathode layer are disconnected at the via-hole encapsulation region DD, and on the other hand can protect the third metal layer 13 from being etched upon subsequent etching of the second metal layer 12 to form the isolation pillar of the "I" type.

In some embodiments, the above-described display panel provided by an embodiment of the present disclosure also includes is a second source-drain layer located in the display region and between the passivation layer and the anode layer, a first planarization layer located in the display region and between the second source-drain layer and the anode layer, and a second planarization layer located in the display region and between the passivation layer and the second source-drain layer. In particular, the second source-drain layer, the first planarization layer, and the second planarization layer can refer to in the previous description of the fabricating method of the display panel, which is not repeated here.

In some embodiments, the above display panel provided by an embodiment of the present disclosure, as shown in FIGS. 4O and 5O, further includes a light emitting layer 80 (only the via-hole encapsulation region DD is shown) on a side of the anode layer (first pad 61) facing away from the substrate 10, and a cathode layer 90 on a side of the light emitting layer 80 facing away from the substrate 10, both the light emitting layer 80 and the cathode layer 90 being disconnected at the location of the isolation pillar 102.

In some embodiments, the above-described display panel provided by an embodiment of the present disclosure may also include other functional structures well known to those skilled in the art, such as an active layer, a gate electrode, and an encapsulation layer on a side of the cathode layer facing away from the substrate, and the like, which are not described in detail herein.

Based on the same inventive concept, an embodiment of the present disclosure also provides a display device including the above-described display panel provided by an embodiment of the present disclosure. Since the principle of solving the problem of the display device is similar to that of the above-described display panel, the implementation of the display device can refer to the implementation of the aforementioned display panel, and the repetition will not be repeated. The display device may be a mobile phone, a tablet, a television, a display, a laptop, a digital photo frame, a navigator, or the like, and any product or component with the display or touch control function.

In some embodiments, the above-described display device provided by an embodiment of the present disclosure may also include other functional structures well known to those skilled in the art, and will not be described in detail herein.

Embodiments of the present disclosure provide a display panel and a fabricating method thereof, a display device, by forming an isolation pillar prior to forming the anode layer, and completely retaining the photoresist material film layer of the via-hole encapsulation region while etching the anode material film layer, the contact between the etchant that etches the anode material film layer and the second metal layer of the isolation pillar is avoided, thus avoiding the creation of metal particles while forming the anode layer, and further avoiding the problem of undesirable dark spots from the metal particles.

While the preferred embodiments of the present disclosure have been described, further variations and modifications of these embodiments may be made to these embodiments once the basic inventive concepts are known to those skilled in the art. Therefore, the appended claims are intended to be interpreted to encompass preferred embodiments as well as all modifications and modifications falling within the scope of the present disclosure.

It will be apparent to those skilled in the art that various modifications and variations can be made to the disclosed embodiments without departing from the spirit and scope of the disclosed embodiments. Thus, it is intended that the present disclosure include such modifications and variations of the embodiments of the present disclosure provided they come within the scope of the present claims and their equivalents.

What is claimed is:

1. A fabricating method of a display panel, comprising:

providing a substrate, wherein the substrate is provided with a display region, a via-hole, and a via-hole encapsulation region between the display region and the via-hole;

forming a first source-drain material film layer on a side of the substrate;

patterning the first source-drain material film layer to form a first source-drain layer in the display region and at least one isolation pillar transition pattern in the via-hole encapsulation region; wherein each of the at least one isolation pillar transition pattern comprises a first metal layer, a second metal layer, and a third metal layer disposed in stacked;

etching the second metal layer to make a sidewall of the second metal layer concave inward to form a recessed part, wherein the first metal layer, the third metal layer and the second metal layer with the recessed part form the isolation pillar;

forming an anode material film layer on a side of the first source-drain layer facing away from the substrate, making the anode material film layer disconnected at the isolation pillar to form a first pad located on a side of the third metal layer facing away from the substrate and a second pad located around the isolation pillar and on the substrate;

forming a photoresist material film layer on a side of the anode material film layer facing away from the substrate;

exposing the photoresist material film layer to develop to form a patterned photoresist layer in the display region, and completely retaining the photoresist material film layer in the via-hole encapsulation region;

etching the anode material film layer to form an anode layer; and stripping off the photoresist material film layer;

wherein before etching the second metal layer, the method further comprises:

forming a passivation material film layer on a side of the first source-drain layer and the isolation pillar transition pattern facing away from the substrate; and patterning the passivation material film layer to form a passivation layer on the display region on a side of the first source-drain layer facing away from the substrate and a protective layer on a side of the isolation pillar transition pattern facing away from the substrate; wherein the protective layer covers the isolation pillar transition pattern.

2. The fabricating method according to claim 1, wherein, after forming the passivation layer and the protective layer, and before etching the second metal layer, the method further comprises:

forming a second source-drain material film layer on a side of the passivation layer and the protective layer facing away from the substrate;

patterning the second source-drain material film layer with a dry etching process to completely remove the second source-drain material film layer in the via-hole encapsulation region, and form a second source-drain layer in the display region; and the etching the second metal layer, comprises: extending a time of the dry etching process to etch the second metal layer after etching the second source-drain material film layer.

3. The fabricating method according to claim 2, wherein after forming the second source-drain layer, and before forming the anode material film layer, the method further comprises:

forming a first planarization material film layer on a side of the second source-drain layer facing away from the substrate; and patterning the first planarization material film layer to completely remove the first planarization material film layer in the via-hole encapsulation region, and form a first planarization layer in the display region.

4. The fabricating method according to claim 2, wherein before forming the second source-drain material film layer on a side of the passivation layer and the protective layer facing away from the substrate, the method further comprises:

forming a second planarization material film layer on a side of the passivation layer and the protective layer facing away from the substrate; and patterning the second planarization material film layer to completely remove the second planarization material film layer in the via-hole encapsulation region, and form a second planarization layer in the display region.

5. The fabricating method according to claim 2, wherein after forming the anode layer, the method further comprises:

forming a light emitting layer on a side of the anode layer facing away from the substrate, wherein the light emitting layer is disconnected at the location of the isolation pillar; and forming a cathode layer on a side of the light emitting layer facing away from the substrate, wherein the cathode layer is disconnected at the location of the isolation pillar.

6. The fabricating method according to claim 1, wherein the patterning the passivation material film layer, comprises: etching the passivation material film layer with a first etching gas; and the etching the second metal layer, comprises: etching the second metal layer with a second etching gas;

wherein the second etching gas and the first etching gas are different.

7. The fabricating method according to claim 6, wherein after forming the isolation pillar, and before forming the anode material film layer on a side of the first source-drain layer facing away from the substrate, the method further comprises:

forming a second source-drain material film layer on a side of the passivation layer and the protective layer facing away from the substrate; and patterning the second source-drain material film layer with a dry etching process to completely remove the second source-drain material film layer in the via-hole encapsulation region, and form a second source-drain layer in the display region.

8. The fabricating method according to claim 7, wherein after forming the second source-drain layer, and before forming the anode material film layer, the method further comprises:

forming a first planarization material film layer on a side of the second source-drain layer facing away from the substrate; and patterning the first planarization material film layer to completely remove the first planarization material film layer in the via-hole encapsulation region, and form a first planarization layer in the display region.

9. The fabricating method according to claim 7, wherein before forming the second source-drain material film layer on a side of the passivation layer and the protective layer facing away from the substrate, the method further comprises:

forming a second planarization material film layer on a side of the passivation layer and the protective layer facing away from the substrate; and patterning the second planarization material film layer to completely remove the second planarization material film layer in the via-hole encapsulation region, and form a second planarization layer in the display region.

10. The fabricating method according to claim 7, wherein after forming the anode layer, the method further comprises:

forming a light emitting layer on a side of the anode layer facing away from the substrate, wherein the light emitting layer is disconnected at the location of the isolation pillar; and forming a cathode layer on a side of the light emitting layer facing away from the substrate, wherein the cathode layer is disconnected at the location of the isolation pillar.

11. The fabricating method according to claim 1, wherein after forming the anode layer, the method further comprises:

forming a light emitting layer on a side of the anode layer facing away from the substrate, wherein the light emitting layer is disconnected at the location of the isolation pillar; and forming a cathode layer on a side of the light emitting layer facing away from the substrate, wherein the cathode layer is disconnected at the location of the isolation pillar.

12. A display panel, wherein the display panel is fabricated according to the fabricating method of the display panel according to claim 1, the display panel is provided with a via-hole extending through the display panel in a thickness direction, and the display panel comprises:

a substrate, wherein the substrate provided with a display region and a via-hole encapsulation region between the display region and the via-hole;

a first source-drain layer located in the display region of the substrate;

at least one isolation pillar located at the via-hole encapsulation region of the substrate;

wherein the isolation pillar and the first source-drain layer are disposed on a same layer and made of a same material, the isolation pillar comprises a first metal layer, a second metal layer, and a third metal layer disposed in stacked, and a sidewall of the second metal layer is concave inward to form a recessed part;

an anode layer disposed in the display region and on a side of the first source-drain layer facing away from the substrate;

a first pad disposed in the via-hole encapsulation region and on a side of the isolation pillar facing away from the substrate, wherein the first pad and the anode layer are disposed on a same layer and made of a same material; and a second pad disposed around the isolation pillar and on the substrate, wherein the second pad and the anode layer are disposed on a same layer and made of a same material;

wherein the anode layer, the first pad, and the second pad are disconnected from each other;

wherein the display panel further comprises: a passivation layer located in the display region and between the first source-drain layer and the anode layer, and a protective layer located in the via-hole encapsulation region and between the isolation pillar and the first pad;

wherein the protective layer and the passivation layer are disposed on a same layer and made of a same material, and the protective layer covering the isolation pillar.

13. The display panel according to claim 12, further comprising: a second source-drain layer located in the display region and between the passivation layer and the anode layer;

a first planarization layer located in the display region and between the second source-drain layer and the anode layer; and a second planarization layer located in the display region and between the passivation layer and the second source-drain layer.

14. The display panel according to claim 12, further comprising: a light emitting layer on a side of the anode layer facing away from the substrate; and a cathode layer on a side of the light emitting layer facing away from the substrate;

wherein the light emitting layer and the cathode layer each are disconnected at the location of the isolation pillar.

15. A display device, comprising the display panel according to claim 12.

16. The display device according to claim 15, wherein the display panel further comprises: a second source-drain layer located in the display region and between the passivation layer and the anode layer;

a first planarization layer located in the display region and between the second source-drain layer and the anode layer; and a second planarization layer located in the display region and between the passivation layer and the second source-drain layer.

17. The display device according to claim 15, wherein the display panel further comprises: a light emitting layer on a side of the anode layer facing away from the substrate; and a cathode layer on a side of the light emitting layer facing away from the substrate;

wherein the light emitting layer and the cathode layer each are disconnected at the location of the isolation pillar.

* * * * *